(12) United States Patent
Haller et al.

(10) Patent No.: US 8,394,699 B2
(45) Date of Patent: Mar. 12, 2013

(54) MEMORY ARRAYS AND METHODS OF FABRICATING MEMORY ARRAYS

(75) Inventors: Gordon A. Haller, Boise, ID (US); Sanh D. Tang, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 12/828,915

(22) Filed: Jul. 1, 2010

(65) Prior Publication Data
US 2010/0273303 A1 Oct. 28, 2010

Related U.S. Application Data

(62) Division of application No. 11/507,696, filed on Aug. 21, 2006, now Pat. No. 7,772,632.

(51) Int. Cl.
*H01L 21/336* (2006.01)
*H01L 21/3205* (2006.01)
*H01L 21/4763* (2006.01)

(52) U.S. Cl. .................. 438/259; 438/270; 438/589

(58) Field of Classification Search .................. 438/259, 438/270, 589, 244–254, E27.096, E27.055, 438/E27.58, E27.57
See application file for complete search history.

(56) References Cited

U.S. PATENT DOCUMENTS

| | | |
|---|---|---|
| 4,455,740 A | 6/1984 | Iwai |
| 4,722,910 A | 2/1988 | Yasaitis |
| 4,835,741 A | 5/1989 | Baglee |
| 4,922,460 A | 5/1990 | Furutani et al. |
| 4,931,409 A | 6/1990 | Nakajima et al. |
| 4,937,641 A | 6/1990 | Sunami et al. |
| 4,939,100 A | 7/1990 | Jeuch et al. |
| 4,939,793 A | 7/1990 | Stewart |
| 4,979,004 A | 12/1990 | Esquivel et al. |
| 5,013,680 A | 5/1991 | Lowrey et al. |
| 5,014,110 A | 5/1991 | Satoh |
| 5,021,355 A | 6/1991 | Dhong et al. |
| 5,047,117 A | 9/1991 | Roberts |
| 5,107,459 A | 4/1992 | Chu et al. |
| 5,108,938 A | 4/1992 | Solomon |
| 5,122,848 A | 6/1992 | Lee et al. |
| 5,160,491 A | 11/1992 | Mori |
| 5,244,824 A | 9/1993 | Sivan |
| 5,254,218 A | 10/1993 | Roberts et al. |
| 5,281,548 A | 1/1994 | Prall |
| 5,358,879 A | 10/1994 | Brady et al. |
| 5,376,575 A | 12/1994 | Kim et al. |
| 5,392,237 A | 2/1995 | Iida |

(Continued)

FOREIGN PATENT DOCUMENTS

| DE | 44 08 764 A1 | 9/1994 |
|---|---|---|
| DE | 04408764 | 9/1994 |

(Continued)

OTHER PUBLICATIONS

PCT/US2004/034587, Jun. 9, 2005, Search Report.

(Continued)

*Primary Examiner* — Cuong Q Nguyen
(74) *Attorney, Agent, or Firm* — Wells St. John, P.S.

(57) ABSTRACT

A memory array includes a plurality of memory cells formed on a semiconductor substrate. Individual of the memory cells include first and second field effect transistors respectively comprising a gate, a channel region, and a pair of source/drain regions. The gates of the first and second field effect transistors are hard wired together. A conductive data line is hard wired to two of the source/drain regions. A charge storage device is hard wired to at least one of the source/drain regions other than the two. Other aspects and implementations are contemplated, including methods of fabricating memory arrays.

17 Claims, 7 Drawing Sheets

U.S. PATENT DOCUMENTS

| | | |
|---|---|---|
| 5,413,949 A | 5/1995 | Hong |
| 5,446,299 A | 8/1995 | Acovic et al. |
| 5,467,305 A | 11/1995 | Bertin et al. |
| 5,472,893 A | 12/1995 | Iida |
| 5,480,838 A | 1/1996 | Mitsui |
| 5,496,751 A | 3/1996 | Wei et al. |
| 5,502,320 A | 3/1996 | Yamada et al. |
| 5,504,357 A | 4/1996 | Kim et al. |
| 5,512,770 A | 4/1996 | Hong |
| 5,514,604 A | 5/1996 | Brown |
| 5,532,089 A | 7/1996 | Adair et al. |
| 5,567,634 A | 10/1996 | Hebert |
| 5,573,837 A | 11/1996 | Roberts et al. |
| 5,574,621 A | 11/1996 | Sakamoto et al. |
| 5,612,559 A | 3/1997 | Park et al. |
| 5,619,057 A | 4/1997 | Komatsu |
| 5,687,119 A | 11/1997 | Park |
| 5,693,549 A | 12/1997 | Kim |
| 5,714,412 A | 2/1998 | Liang et al. |
| 5,714,786 A | 2/1998 | Gonzalez et al. |
| 5,739,066 A | 4/1998 | Pan |
| 5,753,947 A | 5/1998 | Gonzalez |
| 5,763,305 A | 6/1998 | Chao |
| 5,792,687 A | 8/1998 | Jeng et al. |
| 5,792,690 A | 8/1998 | Sung |
| 5,798,544 A | 8/1998 | Ohya et al. |
| 5,817,552 A | 10/1998 | Roesner et al. |
| 5,841,611 A | 11/1998 | Sakakima et al. |
| 5,869,359 A | 2/1999 | Prabhakar |
| 5,869,382 A | 2/1999 | Kubota |
| 5,909,618 A | 6/1999 | Forbes et al. |
| 5,963,469 A | 10/1999 | Forbes |
| 5,964,750 A | 10/1999 | Tulleken et al. |
| 5,972,754 A | 10/1999 | Ni et al. |
| 5,977,579 A | 11/1999 | Noble |
| 6,005,273 A | 12/1999 | Gonzalez et al. |
| 6,015,990 A | 1/2000 | Hieda et al. |
| 6,033,963 A | 3/2000 | Huang et al. |
| 6,037,212 A | 3/2000 | Chao |
| 6,059,553 A | 5/2000 | Jin et al. |
| 6,063,669 A | 5/2000 | Takaishi |
| 6,072,209 A | 6/2000 | Noble et al. |
| 6,090,693 A | 7/2000 | Gonzalez et al. |
| 6,096,596 A | 8/2000 | Gonzalez |
| 6,108,191 A | 8/2000 | Bruchhaus et al. |
| 6,114,735 A | 9/2000 | Batra et al. |
| 6,120,952 A | 9/2000 | Pierrat et al. |
| 6,124,611 A | 9/2000 | Mori |
| 6,127,699 A | 10/2000 | Ni et al. |
| 6,150,687 A | 11/2000 | Noble et al. |
| 6,168,996 B1 | 1/2001 | Numazawa et al. |
| 6,184,086 B1 | 2/2001 | Kao |
| 6,187,643 B1 | 2/2001 | Borland |
| 6,191,470 B1 | 2/2001 | Forbes et al. |
| 6,215,149 B1 | 4/2001 | Lee et al. |
| 6,225,669 B1 | 5/2001 | Long et al. |
| 6,255,165 B1 | 7/2001 | Thurgate et al. |
| 6,258,650 B1 | 7/2001 | Sunouchi |
| 6,259,142 B1 | 7/2001 | Dawson et al. |
| 6,274,497 B1 | 8/2001 | Lou |
| 6,284,419 B2 | 9/2001 | Pierrat et al. |
| 6,297,106 B1 | 10/2001 | Pan et al. |
| 6,300,177 B1 | 10/2001 | Sundaresan et al. |
| 6,303,518 B1 | 10/2001 | Tian et al. |
| 6,306,755 B1 | 10/2001 | Zheng |
| 6,319,644 B2 | 11/2001 | Pierrat et al. |
| 6,323,506 B1 | 11/2001 | Alok |
| 6,323,528 B1 | 11/2001 | Yamazaki et al. |
| 6,331,461 B1 | 12/2001 | Juengling |
| 6,337,497 B1 | 1/2002 | Hanafi et al. |
| 6,340,614 B1 | 1/2002 | Tseng |
| 6,348,385 B1 | 2/2002 | Cha et al. |
| 6,349,052 B1 | 2/2002 | Hofmann et al. |
| 6,362,506 B1 | 3/2002 | Miyai |
| 6,372,554 B1 | 4/2002 | Kawakita et al. |
| 6,383,861 B1 | 5/2002 | Gonzalez et al. |
| 6,383,879 B1 | 5/2002 | Kizilyalli et al. |
| 6,391,726 B1 | 5/2002 | Manning |
| 6,399,490 B1 | 6/2002 | Jammy et al. |
| 6,414,356 B1 | 7/2002 | Forbes et al. |
| 6,417,085 B1 | 7/2002 | Batra et al. |
| 6,420,786 B1 | 7/2002 | Gonzalez et al. |
| 6,458,653 B1 | 10/2002 | Jang |
| 6,458,925 B1 | 10/2002 | Fasano |
| 6,459,138 B2 | 10/2002 | Reinberg |
| 6,459,142 B1 | 10/2002 | Tihanyi |
| 6,473,333 B1 | 10/2002 | Tachibana et al. |
| 6,476,444 B1 | 11/2002 | Min |
| 6,495,474 B1 | 12/2002 | Rafferty et al. |
| 6,495,890 B1 | 12/2002 | Ono |
| 6,498,062 B2 | 12/2002 | Durcan et al. |
| 6,552,401 B1 | 4/2003 | Dennison |
| 6,563,183 B1 | 5/2003 | En et al. |
| 6,566,193 B2 | 5/2003 | Hofmann et al. |
| 6,573,559 B2 | 6/2003 | Kitada et al. |
| 6,586,808 B1 | 7/2003 | Xiang et al. |
| 6,624,032 B2 | 9/2003 | Alavi et al. |
| 6,630,720 B1 | 10/2003 | Maszara et al. |
| 6,632,714 B2 | 10/2003 | Yoshikawa |
| 6,632,723 B2 | 10/2003 | Watanabe et al. |
| 6,645,818 B1 | 11/2003 | Sing et al. |
| 6,645,869 B1 | 11/2003 | Chu et al. |
| 6,656,748 B2 | 12/2003 | Hall et al. |
| 6,696,746 B1 | 2/2004 | Farrar et al. |
| 6,706,600 B2 | 3/2004 | Kanaya |
| 6,707,706 B2 | 3/2004 | Nitayama |
| 6,717,200 B1 | 4/2004 | Schamberger et al. |
| 6,720,232 B1 | 4/2004 | Tu et al. |
| 6,724,028 B2 | 4/2004 | Gudesen |
| 6,727,137 B2 | 4/2004 | Brown |
| 6,753,228 B2 | 6/2004 | Azam et al. |
| 6,767,789 B1 | 7/2004 | Bronner et al. |
| 6,784,112 B2 | 8/2004 | Arita et al. |
| 6,818,515 B1 | 11/2004 | Lee et al. |
| 6,818,937 B2 | 11/2004 | Noble et al. |
| 6,818,947 B2 | 11/2004 | Grebs et al. |
| 6,822,261 B2 | 11/2004 | Yamazaki et al. |
| 6,825,093 B2 | 11/2004 | Scholz |
| 6,844,230 B2 | 1/2005 | Reinberg |
| 6,844,591 B1 | 1/2005 | Tran |
| 6,849,496 B2 | 2/2005 | Jaiprakash et al. |
| 6,849,501 B2 | 2/2005 | Rudeck |
| 6,864,536 B2 | 3/2005 | Lin et al. |
| 6,888,198 B1 | 5/2005 | Krivokapic |
| 6,888,770 B2 | 5/2005 | Ikehashi |
| 6,897,109 B2 | 5/2005 | Jin et al. |
| 6,916,711 B2 | 7/2005 | Yoo |
| 6,924,190 B2 | 8/2005 | Dennison |
| 6,930,640 B2 | 8/2005 | Chung et al. |
| 6,939,763 B2 | 9/2005 | Schlosser et al. |
| 6,969,662 B2 | 11/2005 | Fazan et al. |
| 6,979,853 B2 | 12/2005 | Sommer et al. |
| 7,005,349 B2 | 2/2006 | Lee et al. |
| 7,005,710 B1 | 2/2006 | Gonzalez et al. |
| 7,015,543 B2 | 3/2006 | Kawamura et al. |
| 7,022,573 B2 | 4/2006 | Hsiao et al. |
| 7,027,334 B2 | 4/2006 | Ikehashi et al. |
| 7,030,436 B2 | 4/2006 | Forbes |
| 7,042,009 B2 | 5/2006 | Shaheen et al. |
| 7,049,196 B2 | 5/2006 | Noble |
| 7,064,365 B2 | 6/2006 | An et al. |
| 7,071,043 B2 | 7/2006 | Tang et al. |
| 7,075,151 B2 | 7/2006 | Shino |
| 7,084,028 B2 | 8/2006 | Fukuzumi |
| 7,087,956 B2 | 8/2006 | Umebayashi |
| 7,091,092 B2 | 8/2006 | Sneelal et al. |
| 7,122,425 B2 | 10/2006 | Chance et al. |
| 7,122,449 B2 | 10/2006 | Langdo et al. |
| 7,125,774 B2 | 10/2006 | Kim et al. |
| 7,125,781 B2 | 10/2006 | Manning et al. |
| 7,135,371 B2 | 11/2006 | Han et al. |
| 7,160,788 B2 | 1/2007 | Sandhu et al. |
| 7,179,706 B2 | 2/2007 | Patraw et al. |
| 7,199,005 B2 | 4/2007 | Sandhu et al. |
| 7,202,127 B2 | 4/2007 | Busch et al. |
| 7,214,621 B2 | 5/2007 | Nejad et al. |
| 7,244,659 B2 | 7/2007 | Tang et al. |

| | | |
|---|---|---|
| 7,250,650 B2 | 7/2007 | Hieriemann et al. |
| 7,262,089 B2 | 8/2007 | Abbott et al. |
| 7,282,401 B2 | 10/2007 | Juengling |
| 7,285,812 B2 | 10/2007 | Tang et al. |
| 7,319,255 B2 | 1/2008 | Hwang et al. |
| 7,349,232 B2 | 3/2008 | Wang et al. |
| 7,351,666 B2 | 4/2008 | Furukawa et al. |
| 7,361,545 B2 | 4/2008 | Li et al. |
| 7,361,569 B2 | 4/2008 | Tran et al. |
| 7,384,849 B2 | 6/2008 | Parekh et al. |
| 7,390,746 B2 | 6/2008 | Bai et al. |
| 7,393,789 B2 | 7/2008 | Abatchev et al. |
| 7,396,781 B2 | 7/2008 | Wells |
| 7,413,981 B2 | 8/2008 | Tang et al. |
| 7,429,536 B2 | 9/2008 | Abatchev et al. |
| 7,435,536 B2 | 10/2008 | Sandhu et al. |
| 7,455,956 B2 | 11/2008 | Sandhu et al. |
| 7,465,616 B2 | 12/2008 | Tang et al. |
| 7,488,685 B2 | 2/2009 | Kewley |
| 7,494,870 B2 | 2/2009 | Chien et al. |
| 7,495,294 B2 | 2/2009 | Higashitani |
| 7,495,946 B2 | 2/2009 | Gruening-von Schwerin et al. |
| 7,504,686 B2 | 3/2009 | Lutze et al. |
| 7,528,440 B2 | 5/2009 | Forbes et al. |
| 7,535,745 B2 | 5/2009 | Shuto |
| 7,547,640 B2 | 6/2009 | Abatchev et al. |
| 7,547,945 B2 | 6/2009 | Tang et al. |
| 7,560,390 B2 | 7/2009 | Sant et al. |
| 7,564,087 B2 | 7/2009 | Forbes |
| 7,567,452 B2 | 7/2009 | Song et al. |
| 7,576,389 B2 | 8/2009 | Tanaka |
| 7,589,995 B2 | 9/2009 | Tang et al. |
| 7,602,001 B2 | 10/2009 | Gonzalez |
| 7,605,090 B2 | 10/2009 | Gutsche et al. |
| 7,608,503 B2 | 10/2009 | Lung et al. |
| 7,608,876 B2 | 10/2009 | Forbes |
| 7,619,311 B2 | 11/2009 | Lung et al. |
| 7,648,919 B2 | 1/2010 | Tran et al. |
| 7,684,245 B2 | 3/2010 | Schumann et al. |
| 7,700,441 B2 | 4/2010 | Kim et al. |
| 7,732,275 B2 | 6/2010 | Orimoto et al. |
| 7,736,980 B2 | 6/2010 | Juengling |
| 7,755,132 B2 | 7/2010 | Mokhlesi |
| 7,759,193 B2 | 7/2010 | Fishbum |
| 7,902,028 B2 | 3/2011 | Kim et al. |
| 8,084,190 B2 | 12/2011 | Gutsche et al. |
| 2001/0002304 A1 | 5/2001 | Pierrat et al. |
| 2001/0017390 A1 | 8/2001 | Long et al. |
| 2001/0023045 A1 | 9/2001 | Pierrat et al. |
| 2001/0025973 A1 | 10/2001 | Yamada et al. |
| 2001/0038123 A1 | 11/2001 | Yu |
| 2001/0044181 A1 | 11/2001 | Nakamura |
| 2001/0052617 A1 | 12/2001 | Kitada et al. |
| 2002/0022339 A1 | 2/2002 | Kirchhoff |
| 2002/0127796 A1 | 9/2002 | Hofmann et al. |
| 2002/0130378 A1 | 9/2002 | Forbes et al. |
| 2002/0135030 A1 | 9/2002 | Horikawa |
| 2002/0153579 A1 | 10/2002 | Yamamoto |
| 2002/0163039 A1 | 11/2002 | Cleventer et al. |
| 2002/0192911 A1 | 12/2002 | Parke |
| 2003/0001290 A1 | 1/2003 | Nitayama et al. |
| 2003/0011032 A1 | 1/2003 | Umebayashi |
| 2003/0042512 A1 | 3/2003 | Gonzalez |
| 2003/0092238 A1 | 5/2003 | Eriguchi |
| 2003/0094651 A1 | 5/2003 | Suh |
| 2003/0161201 A1 | 8/2003 | Sommer et al. |
| 2003/0164527 A1 | 9/2003 | Sugi et al. |
| 2003/0169629 A1 | 9/2003 | Goebel et al. |
| 2003/0170941 A1 | 9/2003 | Colavito |
| 2003/0170955 A1 | 9/2003 | Kawamura et al. |
| 2003/0234414 A1 | 12/2003 | Brown |
| 2004/0009644 A1 | 1/2004 | Suzuki |
| 2004/0018679 A1 | 1/2004 | Yu et al. |
| 2004/0034587 A1 | 2/2004 | Amberson et al. |
| 2004/0061148 A1 | 4/2004 | Hsu |
| 2004/0065919 A1 | 4/2004 | Wilson et al. |
| 2004/0070028 A1 | 4/2004 | Azam et al. |
| 2004/0092115 A1 | 5/2004 | Hsieh et al. |
| 2004/0125636 A1 | 7/2004 | Kurjanowicz et al. |
| 2004/0150070 A1 | 8/2004 | Okada et al. |
| 2004/0159857 A1 | 8/2004 | Horita et al. |
| 2004/0184298 A1 | 9/2004 | Takahashi et al. |
| 2004/0188738 A1 | 9/2004 | Farnworth et al. |
| 2004/0197995 A1 | 10/2004 | Lee et al. |
| 2004/0222458 A1 | 11/2004 | Hsieh et al. |
| 2004/0224476 A1 | 11/2004 | Yamada et al. |
| 2004/0232466 A1 | 11/2004 | Birner et al. |
| 2004/0259311 A1 | 12/2004 | Kim |
| 2004/0266081 A1 | 12/2004 | Oh et al. |
| 2005/0017240 A1 | 1/2005 | Fazan |
| 2005/0042833 A1 | 2/2005 | Park et al. |
| 2005/0063224 A1 | 3/2005 | Fazan et al. |
| 2005/0066892 A1 | 3/2005 | Dip et al. |
| 2005/0104156 A1 | 5/2005 | Wasshuber |
| 2005/0106820 A1 | 5/2005 | Tran |
| 2005/0106838 A1 | 5/2005 | Lim et al. |
| 2005/0124130 A1 | 6/2005 | Mathew et al. |
| 2005/0136616 A1 | 6/2005 | Cho et al. |
| 2005/0158949 A1 | 7/2005 | Manning |
| 2005/0167751 A1 | 8/2005 | Nakajima et al. |
| 2005/0275014 A1 | 12/2005 | Kim |
| 2005/0275042 A1 | 12/2005 | Hwang et al. |
| 2005/0287780 A1 | 12/2005 | Manning |
| 2006/0043449 A1 | 3/2006 | Tang et al. |
| 2006/0046407 A1 | 3/2006 | Juengling |
| 2006/0046424 A1 | 3/2006 | Chance et al. |
| 2006/0083058 A1 | 4/2006 | Ohsawa |
| 2006/0113588 A1 | 6/2006 | Wu |
| 2006/0167741 A1 | 7/2006 | Erickson et al. |
| 2006/0194410 A1 | 8/2006 | Sugaya |
| 2006/0204898 A1 | 9/2006 | Gutsche et al. |
| 2006/0216894 A1 | 9/2006 | Parekh et al. |
| 2006/0216922 A1 | 9/2006 | Tran et al. |
| 2006/0261393 A1 | 11/2006 | Tang et al. |
| 2006/0264001 A1 | 11/2006 | Tran et al. |
| 2007/0001222 A1 | 1/2007 | Orlowski et al. |
| 2007/0045712 A1 | 3/2007 | Haller et al. |
| 2007/0048941 A1 | 3/2007 | Tang et al. |
| 2007/0048942 A1 | 3/2007 | Hanson et al. |
| 2007/0051997 A1 | 3/2007 | Haller et al. |
| 2007/0096204 A1 | 5/2007 | Shiratake |
| 2007/0117310 A1 | 5/2007 | Bai et al. |
| 2007/0128856 A1 | 6/2007 | Tran et al. |
| 2007/0138526 A1 | 6/2007 | Tran et al. |
| 2007/0148984 A1 | 6/2007 | Abatchev et al. |
| 2007/0158719 A1 | 7/2007 | Wang |
| 2007/0166920 A1 | 7/2007 | Tang et al. |
| 2007/0178641 A1 | 8/2007 | Kim et al. |
| 2007/0238299 A1 | 10/2007 | Niroomand et al. |
| 2007/0238308 A1 | 10/2007 | Niroomand et al. |
| 2007/0261016 A1 | 11/2007 | Sandhu et al. |
| 2008/0012056 A1 | 1/2008 | Gonzalez |
| 2008/0012070 A1 | 1/2008 | Juengling |
| 2008/0042179 A1 | 2/2008 | Haller et al. |
| 2008/0061346 A1 | 3/2008 | Tang et al. |
| 2008/0099847 A1 | 5/2008 | Tang et al. |
| 2008/0142882 A1 | 6/2008 | Tang et al. |
| 2008/0166856 A1 | 7/2008 | Parekh et al. |
| 2008/0299774 A1 | 12/2008 | Sandhu et al. |
| 2008/0311719 A1 | 12/2008 | Tang et al. |
| 2009/0035665 A1 | 2/2009 | Tran |
| 2009/0173994 A1 | 7/2009 | Min et al. |
| 2009/0311845 A1 | 12/2009 | Tang et al. |
| 2010/0006983 A1 | 1/2010 | Gutsche et al. |
| 2012/0009772 A1 | 1/2012 | Matthew et al. |

FOREIGN PATENT DOCUMENTS

| | | |
|---|---|---|
| DE | 19928781 | 7/2000 |
| EP | 0453998 | 10/1991 |
| EP | 1003219 | 5/2000 |
| EP | 1067597 | 1/2001 |
| EP | 1089344 | 4/2001 |
| EP | 1125167 | 8/2001 |
| EP | 1271632 | 1/2003 |
| EP | 1391939 | 2/2004 |
| EP | 1696477 | 8/2006 |
| EP | 100114743 | 7/2011 |
| JP | 51-147280 | 12/1976 |

| | | |
|---|---|---|
| JP | 58-220464 | 12/1983 |
| JP | 2002172 | 1/1990 |
| JP | 3219677 | 9/1991 |
| JP | 04-014253 | 1/1992 |
| JP | 07-078977 | 3/1995 |
| JP | 07-106435 | 4/1995 |
| JP | 09-129837 | 5/1997 |
| JP | 2000-208762 | 7/2000 |
| JP | 2001-024161 | 1/2001 |
| JP | 2002-151654 | 5/2002 |
| JP | 2002184958 | 6/2002 |
| JP | 2003017585 | 1/2003 |
| JP | 2004-071935 | 3/2004 |
| JP | 2004-247656 | 9/2004 |
| JP | 2005-142203 | 6/2005 |
| JP | 2005-175090 | 6/2005 |
| JP | 2005-277430 | 6/2005 |
| JP | 2005-093808 | 7/2005 |
| JP | 2005-354069 | 12/2005 |
| KR | 19930006930 | 4/1993 |
| KR | 19940006679 | 4/1994 |
| KR | 10-0640616 | 10/2006 |
| TW | 428308 | 4/2001 |
| TW | 498332 | 8/2002 |
| TW | 574746 | 2/2004 |
| TW | 200411832 | 7/2004 |
| TW | I231042 | 4/2005 |
| TW | I235479 | 7/2005 |
| TW | 200617957 | 6/2006 |
| TW | 096128462 | 6/2011 |
| WO | WO86/03341 | 6/1986 |
| WO | WO97/44826 | 11/1997 |
| WO | WO97/044826 | 11/1997 |
| WO | WO 99/36961 | 7/1999 |
| WO | WO 00/19272 | 4/2000 |
| WO | WO 02/089182 | 11/2002 |
| WO | PCT/US2004/0027898 | 2/2005 |
| WO | WO 2005/024936 | 3/2005 |
| WO | WO2005/083770 | 9/2005 |
| WO | PCT/US2006/006806 | 7/2006 |
| WO | PCT/US2006/006806 | 1/2007 |
| WO | PCT/US2006/006806 | 2/2007 |
| WO | WO 2007/058840 | 5/2007 |
| WO | PCT/US2007/014689 | 1/2009 |
| WO | PCT/US/2006/031555 | 10/2011 |

OTHER PUBLICATIONS

PCT/US2004/034587, Jun. 9, 2005, PCT Written Opinion.
PCT/US2005/030688, Oct. 2, 2006, Search Report.
PCT/US2006/008295, Aug. 3, 2006, IPRP.
PCT/US2006/031555, Dec. 22, 2006, Search Report.
PCT/US2007/001953, Sep. 18, 2007, Written Opinion.
PCT/US2007/001953, Aug. 14, 2008, IPRP.
PCT/US2007/014689, Jan. 14, 2008, Inv to Pay Additional Fees.
PCT/US2007/016573, Jan. 25, 2008, PCT Search Report.
PCT/US2007/016573, Jan. 25, 2008, PCT Written Opinion.
PCT/US2007/016573, Feb. 24, 2009, IPRP.
PCT/US2007/019592, Mar. 19, 2009, IPRP.
PCT/US2007/023767, May 19, 2009, IPRP.
Barth, "ITRS commodity memory roadmap", IEEE Xplore, Jul. 28, 2003, Abstract.
Bashir et al., "Characterization of sidewall defects in selective epitaxial growth of silicon", American Vacuum Society, May/Jun. 1995, pp. 923-927.
Bashir et al., "Reduction of sidewall defect induced leakage currents by the use of nitrided field oxides in silicon selective epitaxial growth isolation for advanced ultralarge scale integration", American Vacuum Society, Mar./Apr. 2000, pp. 695-699.
Bernstein et al., Chapter 3, 3.4-3.5, SOI Device Electrical Properties, pp. 34-53.
Bhave, et al., "Developer-soluble Gap fill materials for patterning metal trenches in Via-first Dual Damascene process", 2004 Society of Photo-Optical Instrumentation Engineers, Proceedings of SPIE: Advances in Resist Technology and Processing XXI, vol. 5376, 2004.
Chen et al., "The Enhancement of Gate-Induced-Drain-Leakage (GIDL) Current in Short-Channel SOI MOSFET and its Application in Measuring Lateral Bipolar Current Gain B," IEEE Electron Device Letters, vol. 13, No. 11, pp. 572-574 (Nov. 1992).
Choi et al., "Investigation of Gate-Induced Drain Leakage (GIDL) Current in Thin Body Devices: Single-Gate Ultrathin Body, Symmetrical Double-Gate, and Asymmetrical Double-Gate MOSFETs" Jpn. J. Appl. Phys., vol. 42, pp. 2073-2076 (2003).
Clarke, "Device Structures Architectures compatible with conventional silicon processes—Vertical transistors plumbed for memory, logic", Electronic Engineering Times, p. 24, Feb. 14, 2000.
Clarke, "Device Structures Artchitectures compatible with conventional silicon processes—Vertical transistors plumbed for memory, logic", Abstract, Electronic Engineering Times, Feb. 14, 2000, p. 24.
Fazan et al., "MOSFET design simplifies DRAM", EE Times, May 13, 2002, pp. 1-4.
Gonzalez et al., "A dynamic source-drain extension MOSFET using a separately biased conductive spacer", Solid-State Electronics, vol. 46, pp. 1525-1530 (2002).
Hammad et al., "The Pseudo-Two-Dimensional Approach to Model the Drain Section in SOI MOSFETs", 2001 IEEE Transactions on Electron Devices, vol. 48, No. 2, Feb. 2001, pp. 386-387.
Hara, "Toshiba cuts capacitor from DRAM cell design", EE Times, Feb. 7, 2002, pp. 1-3.
Henkels et al., "Large-Signal 2T, 1C DRAM Cell: Signal and Layout Analysis", 1994 IEEE Journal of Solid-State Circuits, Jul. 29, 1994, No. 7, pp. 829-832.
Henkels, W.H. et al., "Large-Signal 2T 1C Dram Cell: Signal and Layout Analysis", 8107 IEEE J. of Solid-State Circuits 29 (Jul. 1994), No. 7, pp. 829-832.
Keast et al., "Silicon Contact Formation and Photoresist Planarization Using Chemical Mechanical Polishing", 1994 ISMIC, pp. 204-205.
Keast, et al., "Silicon Contact Formation and Photoresist Planarization Using Chemical Mechanical Polishing", 1994 ISMIC, Jun. 7-8, 1994 VMIC Conference, pp. 204-205.
Kim et al., "The Breakthrough in data retention time of DRAM using Recess-Chanell-Array Transistor (RCAT) for 88nm feature size and beyond", 2003 Symposium on VLSI Technology Digest of Technical Papers, 2 pages.
Kim H.S. et al., "An Outstanding and Highly Manufacturable 80nm DRAM Technology", 2003 IEEE, 4 pages.
Kuo et al., "A Capacitorless Double-Gate DRAM Cell Design for High Density Applications", IEEE, IEDM, pp. 843-846 (2002).
Lammers, "Bell Labs opens gate to deeper-submicron CMOS", Electronic Engineering Times, Dec. 6, 1999, p. 18.
Liu, "Dual-Work-Function Metal Gates by Full Silicidation of Poly-Si with Co-Ni Bi-Layers", 2005 IEEE, vol. 26, No. 4, Apr. 2005, pp. 228-230.
Lusky et al., "Investigation of Channel Hot Electron Injection by Localized Charge-Trapping Nonvolatile Memory Devices", IEEE Transactions on Electron Devices, vol. 51, No. 3, pp. 444-451 (Mar. 2004).
Lusky, et al., "Investigation of Channel Hot Electron Injection by Localized Charge-Trapping Nonvolatile Memory Devices", IEEE Transactions on Electron Devices, vol. 51, No. 3, Mar. 2004, pp. 444-451.
Maeda et al., "Impact of a Vertical Pi-Shape Transistor (VPiT) Cell for 1 Gbit DRAM and Beyond", IEEE Transactions on Electron Devices Dec. 1995, No. 12, pp. 2117-2124.
Minami et al., "A Floating Body Cell (FBC) Fully Compatible with 90nm CMOS Technology (CMOS IV) for 128Mb SOI DRAM", IEEE, 2005, 4 pages.
Minami et al., "A High Speed and High Reliability MOSFET Utilizing an Auxiliary Gate", 1990 Symposium on VLSI Technology, IEEE, pp. 41-42 (1990).
Mo et al., "Formation and Properties of ternary silicide (CoxNi1-x) Si2 thin films", 1998 IEEE, pp. 271-274.
Ranica et al., "A One Transistor Cell on Bulk Substrate (1T-Bulk) for Low-Cost and High Density eDRAM", 2004 Symposium on VLSI Technology Digest of Technical Papers, pp. 128-129.
Risch et al., "Vertical MOS Transistors with 70 nm Channel Length", IEEE Transactions on Electron Devices, vol. 43, No. 9, Sep. 1996, pp. 1495-1498.

Sivagnaname et al., "Stand-by Current in PD-SOI Pseudo-nMOS Circuits", 2003 IEEE, pp. 95-96.

Sunouchi et al., "Double LDD Concave (DLC) Structure for Sub-Half Micron MOSFET", IEEE, IEDM, pp. 226-228 (1988).

Tanaka et al., "Scalability Study on a Capacitorless 1T-DRAM: From Single-gate PD-SOI to Double-gate FinDRAM", IEEE, 2004, pp. 37.5.1-37.5.4.

Tiwari et al., "Straddle Gate Transistors: High Ion/Ioff Transistors at Short Gate Lengths", IBM Research Article, pp. 26-27 (pre-Mar. 2006).

Villaret, "Mechanisms of charge modulation in the floating body of triple-well nMOSFET capacitor-less DRAMs", Microelectronic Engineering 72, 2004, pp. 434-439.

Wang et al., "Achieving Low junction capacitance on bulk SI MOSFET using SDOI process", Micron Technology, Inc., 12 pages.

Yoshida et al., "A Capacitorless 1T-DRAM Technology Using Gate-Induced Drain-Leakage (GIDL) Current for Low-Power and High-Speed Embedded Memory", IEEE Transactions on Electron Devices, vol. 53, No. 4, pp. 692-697 (Apr. 2006).

Yoshida et al., "A Design of a Capacitorless 1T-DRAM Cell Using Gate-induced Drain Leakage (GIDL) Current for Low-power and High-speed Embedded Memory", 2003 IEEE, 4 pages.

Kraynik, "Foam Structure: from soap froth to solid foams", MRS Bulletin, Apr. 2003, pp. 275-278.

Wang et al., "Achieving Low junction capacitance on bulk SI MOSFET using SDOI process", Micron Technology, Inc., 12 pages; Jun. 2003.

Yasaitis et al., "A modular process for integrating thick polysilicon MEMS devices with submicron CMOS", Analog Devices. Pre-2004.

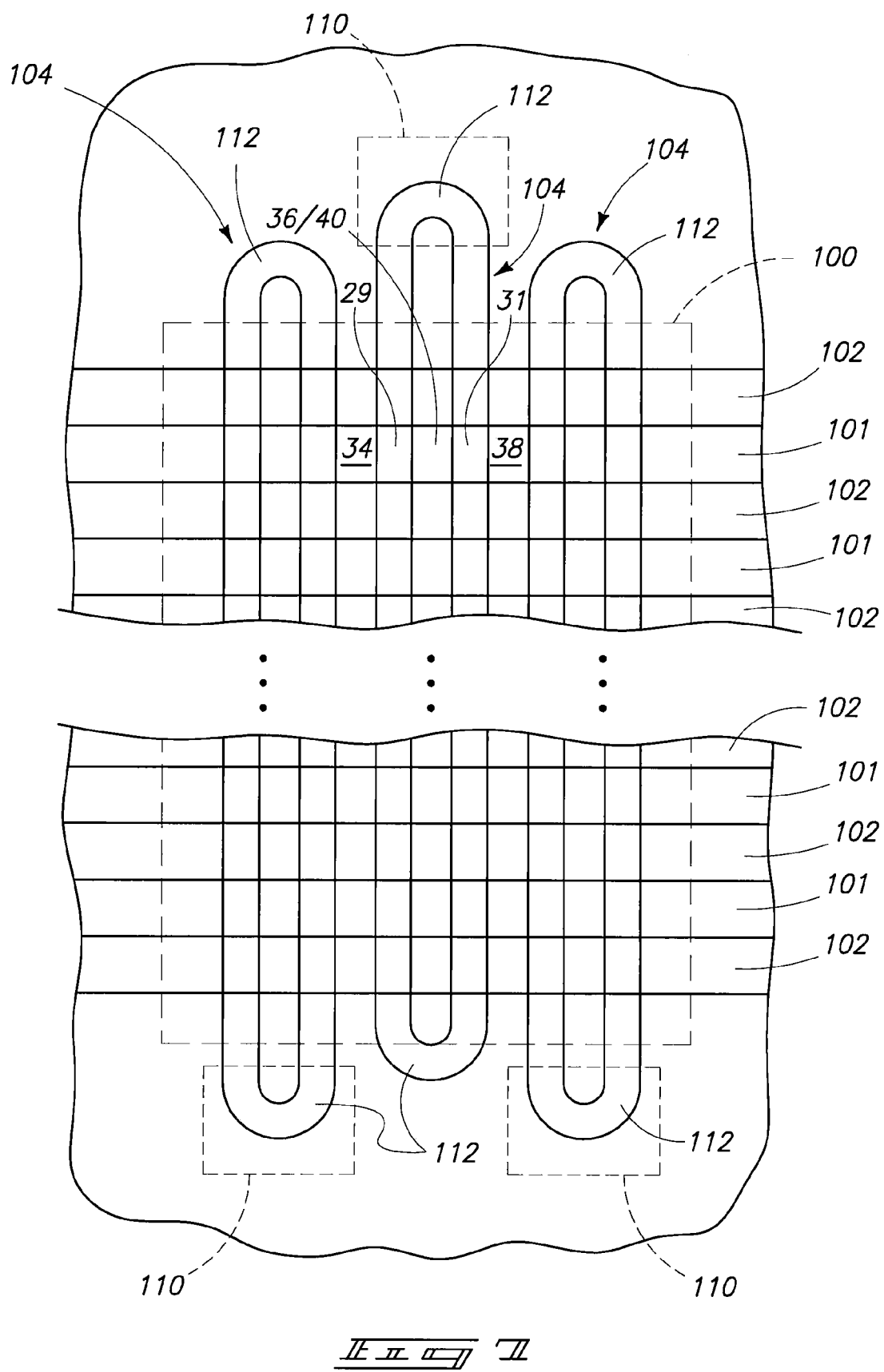

MEMORY ARRAYS AND METHODS OF FABRICATING MEMORY ARRAYS

RELATED PATENT DATA

This patent resulted from a divisional application of U.S. patent application Ser. No. 11/507,696, filed Aug. 21, 2006, entitled "Memory Arrays and Methods of Fabricating Memory Arrays", naming Gordon A. Haller and Sanh D. Tang as inventors, the disclosure of which is incorporated by reference.

TECHNICAL FIELD

This invention relates to memory arrays and to methods of fabricating memory arrays.

BACKGROUND OF THE INVENTION

Memory is one type of integrated circuitry, and is used in computer systems for storing data. Such is typically fabricated in one or more arrays of individual memory cells. The memory cells might be volatile, semi-volatile, or non-volatile. Non-volatile memory cells can store data for extended periods of time, and in many instances including when the computer is turned off. Volatile memory dissipates and therefore requires to be refreshed/rewritten, and in many instances including multiple times per second.

One example volatile semiconductor memory is dynamic random access memory (DRAM), with an exemplary prior art DRAM cell being shown in FIG. 1. FIG. 1 depicts an individual/single DRAM cell 10 comprising a field effect access transistor 12 and a storage capacitor 14. Field effect transistor 12 includes a pair of source/drain regions 15, 16, and a gate 17. Source/drain region 16 is depicted as connecting with storage capacitor 14, while source/drain region 15 electrically connects with a bit line 18. Gate 17 is typically in the form of an elongated word line forming gates of several field effect transistors formed in a "row". Bit line 18 typically connects with a plurality of source/drain regions 15 of field effect transistors formed in a "column" which is generally typically orthogonal to a gate/word line row. In many instances, pairs of immediately adjacent field effect transistors might share a common source/drain region 15 to which a bit line electrically connects.

Dual transistor DRAM cells utilizing capacitors have also been proposed, for example those disclosed in U.S. Pat. No. 6,818,937.

While the invention was motivated in addressing the above identified issues, it is in no way so limited. The invention is only limited by the accompanying claims as literally worded, without interpretative or other limiting reference to the specification, and in accordance with the doctrine of equivalents.

BRIEF DESCRIPTION OF THE DRAWINGS

Example embodiments of the invention are described below with reference to the following accompanying drawings.

FIG. 7 is a further expanded diagrammatic top plan view of a substrate fragment in accordance with embodiments of the invention.

DETAILED DESCRIPTION OF EXAMPLE EMBODIMENTS

This disclosure of the invention is submitted in furtherance of the constitutional purposes of the U.S. Patent Laws "to promote the progress of science and useful arts" (Article 1, Section 8).

Embodiments of the invention encompass memory arrays and methods of fabricating memory arrays. Memory array constructions might be fabricated by any method, and not necessarily limited by the methods of fabricating a memory array as disclosed herein. Likewise, methods of fabricating a memory array are not necessarily limited by the memory array constructions as disclosed herein.

Exemplary embodiments of memory array constructions are initially described with reference to FIG. 2. In various implementations, memory arrays fabricated in accordance with the invention comprise a plurality of memory cells formed on a semiconductor substrate. In the context of this document, the term "semiconductor substrate" or "semiconductive substrate" is defined to mean any construction comprising semiconductive material, including, but not limited to, bulk semiconductive materials such as a semiconductive wafer (either alone or in assemblies comprising other materials thereon), and semiconductive material layers (either alone or in assemblies comprising other materials). The term "substrate" refers to any supporting structure, including, but not limited to, the semiconductive substrates described above. Example semiconductor substrates include bulk semiconductor substrates, for example bulk monocrystalline silicon. Embodiments of the invention might also, of course, be utilized in semiconductor-on-insulator substrates and any other substrate (whether existing or yet-to-be developed) within or upon which an operable memory array could be fabricated.

Figure 1:
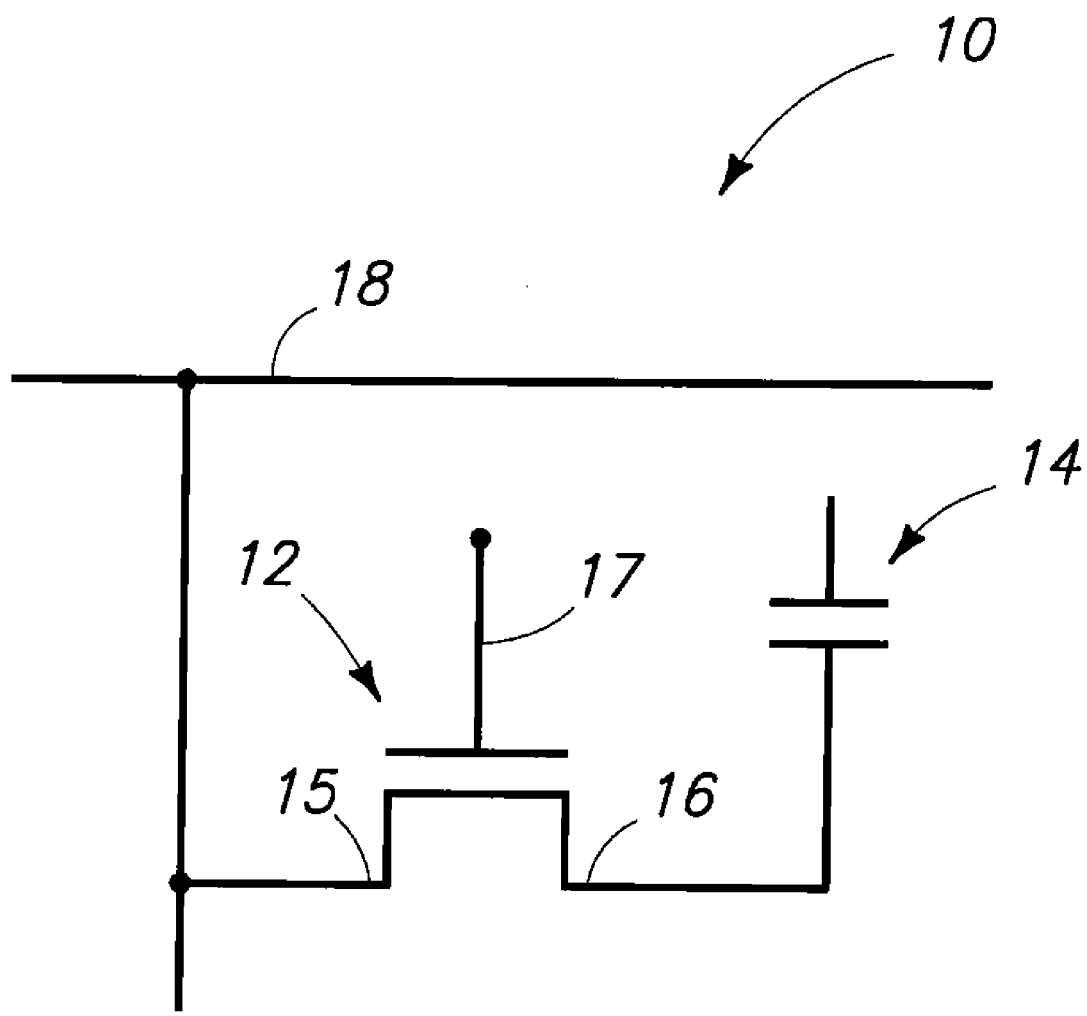
FIG. 1 is a schematic of a prior art DRAM cell.
Figure 2:
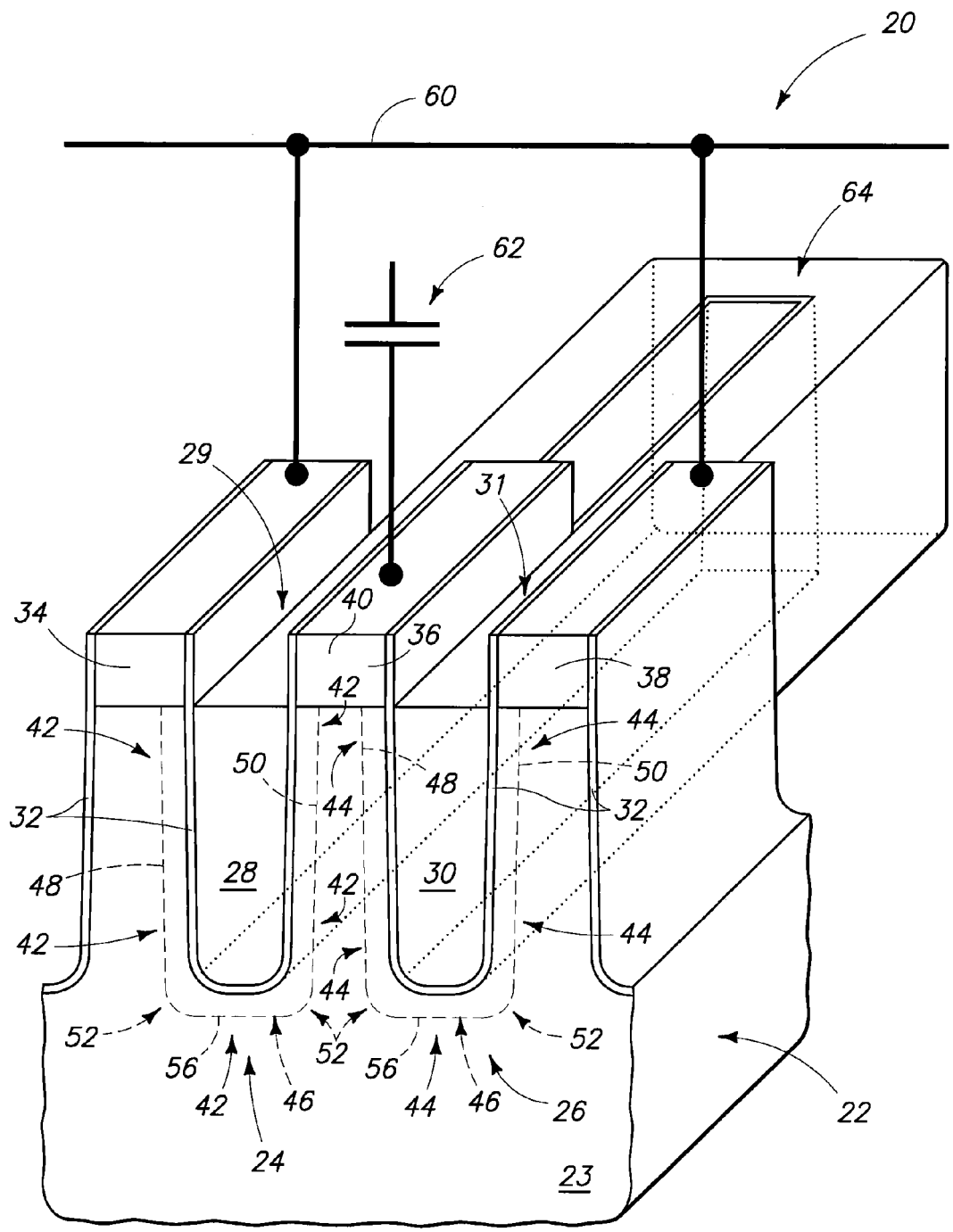
FIG. 2 is a diagrammatic perspective cutaway view of a substrate fragment and partial schematic comprising a memory cell in accordance with various embodiments of the invention.

The memory array will comprise a plurality of memory cells, with an exemplary individual memory cell in accordance with various implementations of the invention being indicated generally with reference numeral 20 in FIG. 2. Not all memory cells of a memory array necessarily have identical construction, but may and typically include a plurality of substantially identically constructed individual memory cells. Regardless and by way of example only, FIG. 2 depicts a semiconductor substrate 22 comprising semiconductive material 23. Semiconductive material 23 might comprise bulk semiconductor material, for example bulk monocrystalline silicon which has been suitably background doped with a conductivity-enhancing impurity either globally or relative to smaller isolated regions and/or wells. Other semiconductor materials and substrates are, of course, contemplated. By way of example only, exemplary background doping of semiconductive material 23 is of p-type of a suitable dose/concentration such that channel regions of n-type field effect transistors can be formed upon gate activation.

Individual memory cell 20 includes a first field effect transistor 24 and a second field effect transistor 26. Each comprises a gate, a channel region, and a pair of source/drain regions. For example, first field effect transistor 24 is depicted as comprising a gate 28, and second field effect transistor 26 is depicted as comprising a gate 30. In the depicted and but one example embodiment, gates 28 and 30 are received within openings 29 and 31, respectively, formed within semiconductive material 23 of semiconductor substrate 22. In one implementation, openings 29 and 31 are in the form of elongated trenches, and conductive material received therewithin will form word lines/gates for multiple memory cells. By way of example only, exemplary open widths of openings 29, 31 and the spacing between the depicted adjacent openings are preferably less than or equal to 500 Angstroms. An exemplary depth for the depicted trench openings 29 and 31 from an outermost surface of semiconductive material 23 is from 100 Angstroms to 500 Angstroms. Example conductive materials for gates 28 and 30 are conductively doped semiconductive materials and/or metal. In the context of this document, "metal" defines any of an elemental metal, an alloy or mixture of elemental metals, or conductive metal compounds. By way of example only, one example conductive material for gates 28 and 30 is titanium nitride.

A gate dielectric 32 is depicted as lining openings 29 and 31. Any suitable existing or yet-to-be developed dielectric is usable, with silicon dioxide being but one example, and of an example thickness range of from 30 Angstroms to 80 Angstroms.

First field effect transistor 24 comprises a pair of source/drain regions 34 and 36, and second field effect transistor 26 comprises a pair of source/drain regions 38 and 40. Such can be formed by any of ion implanting, diffusion doping, etc., and any other process whether existing or yet to be developed. An example thickness of such source/drain regions 34, 36, 38 and 40 is less than or equal to 500 Angstroms from an outer surface of material 23. In the depicted example embodiment, one of the pair of source/drain regions is received laterally intermediate gates 28 and 30, and is shared by first and second transistors 24 and 26. In the depicted exemplary embodiment, source/drain region 36 of first field effect transistor 24 and source/drain region 40 of second field effect transistor 26 constitute the same source/drain region and which is shared by such first and second field effect transistors. In one implementation, and as shown, other source/drain region 34 of pair 34/36 is received laterally outward of gate 28, and other source/drain region 38 of pair 38/40 is received laterally outward of gate 30. In the depicted example embodiment, shared source/drain region 36/40 is received both laterally intermediate gates 28 and 30, and elevationally outward thereof. Further in the depicted embodiment, each of other source/drain regions 34 and 38 is received elevationally outward of gates 28 and 30, and with the depicted source/drain regions being formed in one implementation within bulk semiconductive material 23. However, other constructions are of course contemplated, including, by way of example only, elevated source/drains.

First field effect transistor 24 comprises a channel region 42 and second field effect transistor 26 comprises a channel region 44. In combination, and in but one embodiment, such form a general W-shape in the depicted cross-section. Each channel region 42, 44 comprises a switchable current path 46 in at least one substrate cross-section which extends between shared source/drain region 36/40 and the respective other source/drain region 34 or 38. Preferably as shown, each current path 46 comprises interconnected first and second substantially vertical segments 48 and 50. In the depicted exemplary embodiment, first and second substantially vertical segments 48 and 50, respectively, can be considered as comprising elevationally inner end portions 52, and an interconnecting segment 56 received between first substantially vertical segment 48 and second substantially vertical segment 50 proximate elevationally inner end portions 52. In the depicted exemplary implementation, interconnecting segment 56 is substantially horizontally oriented relative to the depicted general substrate orientation.

FIG. 2 schematically depicts a conductive data line 60 electrically connecting with each of the other source/drain regions 34, 38 of source/drain region pair 34/36 and source/drain region pair 38/40. In one example embodiment, conductive data line 60 is received elevationally outward of gates 28 and 30. FIG. 2 also schematically depicts a charge storage device 62 electrically connecting with shared source/drain region 36/40. In the depicted example embodiment, charge storage device 62 comprises a capacitor.

FIG. 2 schematically depicts conductive data line 60 and charge storage device 62 electrically connecting with their respective source/drain regions, and such might occur in any manner or in any implementation. In one example embodiment, charge storage device 62 is received elevationally outward of gates 28 and 30, and in one example embodiment conductive data line 60 is received elevationally outward of gates 28 and 30. Further in one example embodiment, charge storage device 62 is received elevationally outward of conductive data line 60, for example in one embodiment as will be exemplified in the continuing discussion. Further in one example embodiment, individual memory cells 20 comprise DRAM cells, with conductive data line 60 comprising a bit line.

In one example embodiment, conductive material electrically interconnects gates 28 and 30 of first and second transistors 24 and 26, respectively. For example, FIG. 2 diagrammatically depicts a conductive material region or segment 64 which electrically connects conductive gates 28 and 30. In one exemplary implementation, conductive material 64 which interconnects with gates 28 and 30 is received within a trench which has been formed within semiconductor substrate 22, and even more preferably within semiconductive material 23 of semiconductor substrate 22. Material 23 and likely peripheral insulative material 32 are not shown proximate conductive material 64 for clarity in the depicted diagrammatic perspective cut-away in FIG. 2.

Figure 3:
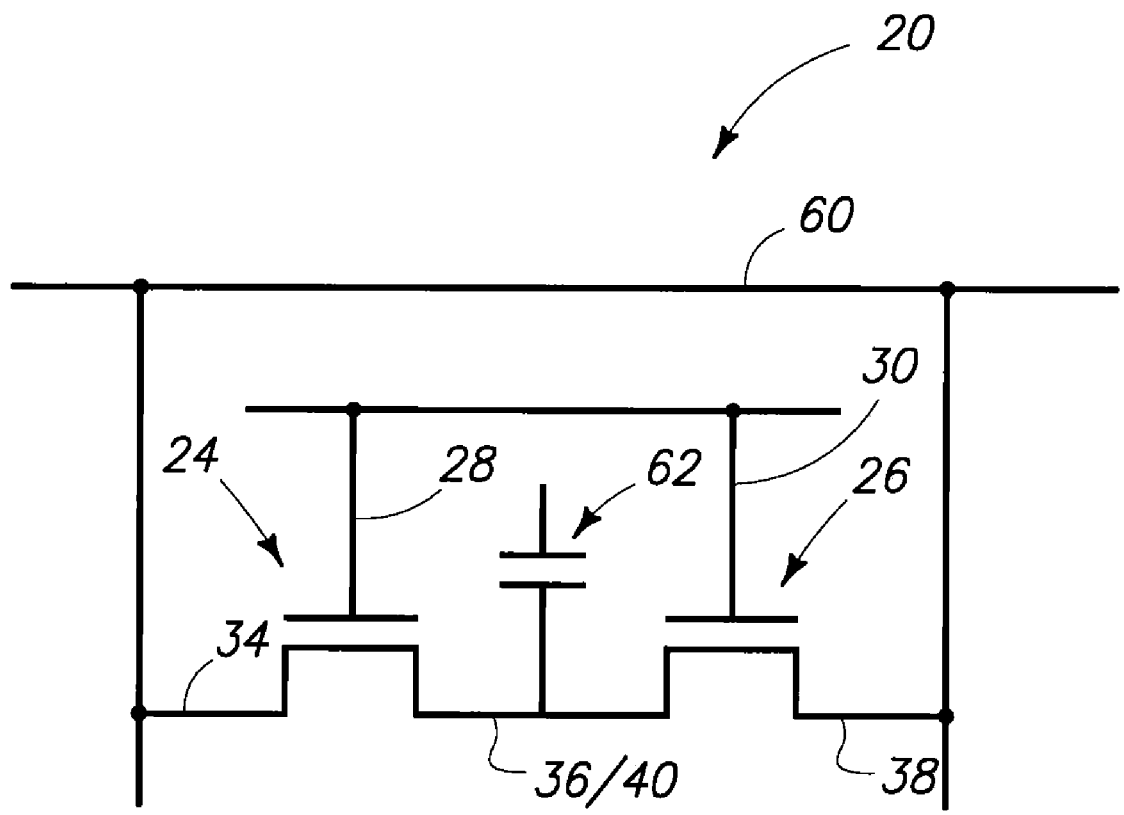
FIG. 3 is a schematic of a single/individual memory cell in accordance with an embodiment of the invention.

One embodiment of the invention includes a memory array which comprises a plurality of memory cells formed on a semiconductor substrate. Individual ones of the memory cells comprise first and second field effect transistors respectively comprising a gate, a channel region, and a pair of source/drain regions. The gates of the first and second field effect transistors are hardwired together. A conductive data line is hardwired to two of the source/drain regions, and a charge storage device is hardwired to at least one of the source/drain regions other than the two. For example, and by way of example only, FIG. 2 diagrammatically depicts an example construction of an individual memory cell of such a memory array, and FIG. 3 schematically depicts such an exemplary individual memory cell.

In one embodiment, one of the source/drain regions is received laterally between the gates. In one embodiment, one of the source/drain regions is shared by the first and second field effect transistors, and in one embodiment the charge storage device is connected to the one shared source/drain region. In one embodiment, the gates are hardwired together by conductive material received in at least one trench formed within semiconductive material of the semiconductor substrate and extending between the gates. However, other embodiments of electrically interconnecting gates are contemplated, for example by a separate interconnecting line or layer, or by any other manner whether existing or yet-to-be developed, and for any aspect of this disclosure. In one embodiment, each channel region comprises a current path in at least one cross-section extending between source/drain regions which comprises interconnected first and second substantially vertical segments. Any other exemplary attribute of the first-described FIG. 2 embodiment is also contemplated.

Figure 4:
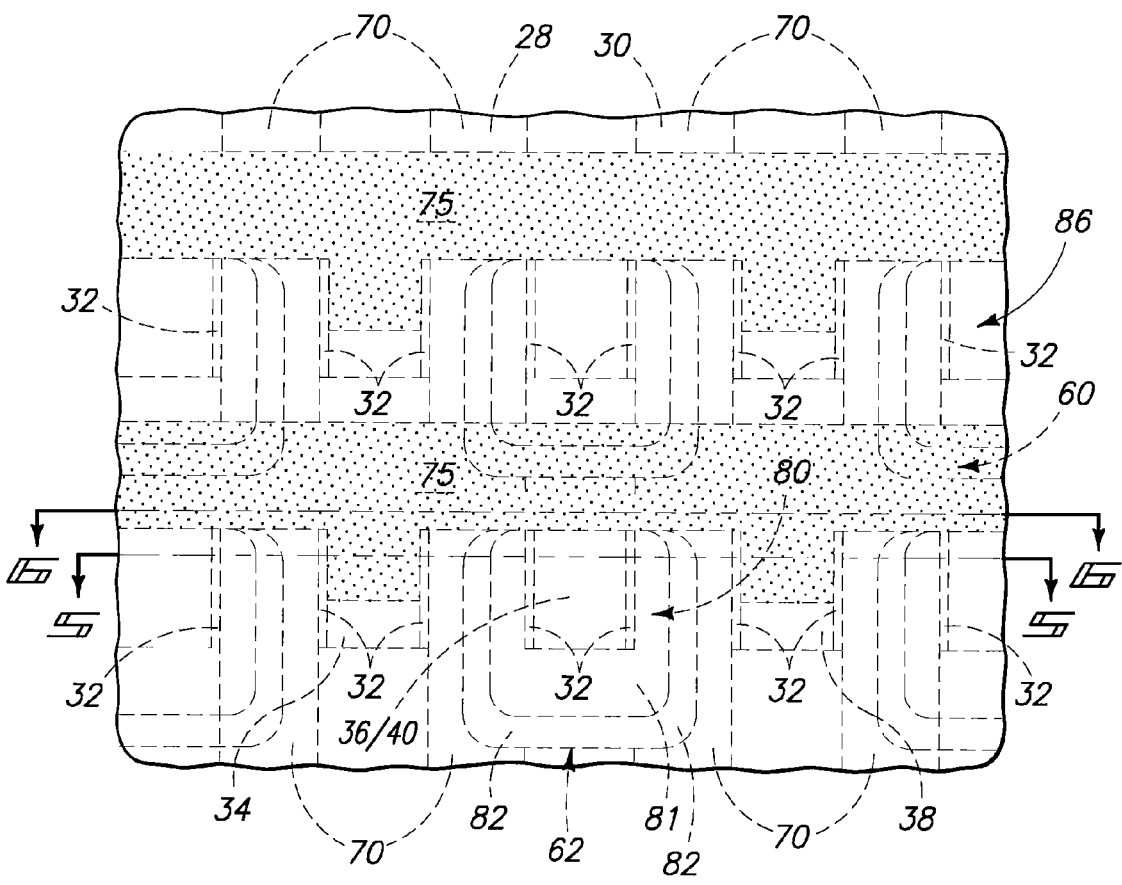
FIG. 4 is an expanded diagrammatic top plan view of a substrate fragment comprising memory cells such as that depicted in FIG. 2.
Figure 5:
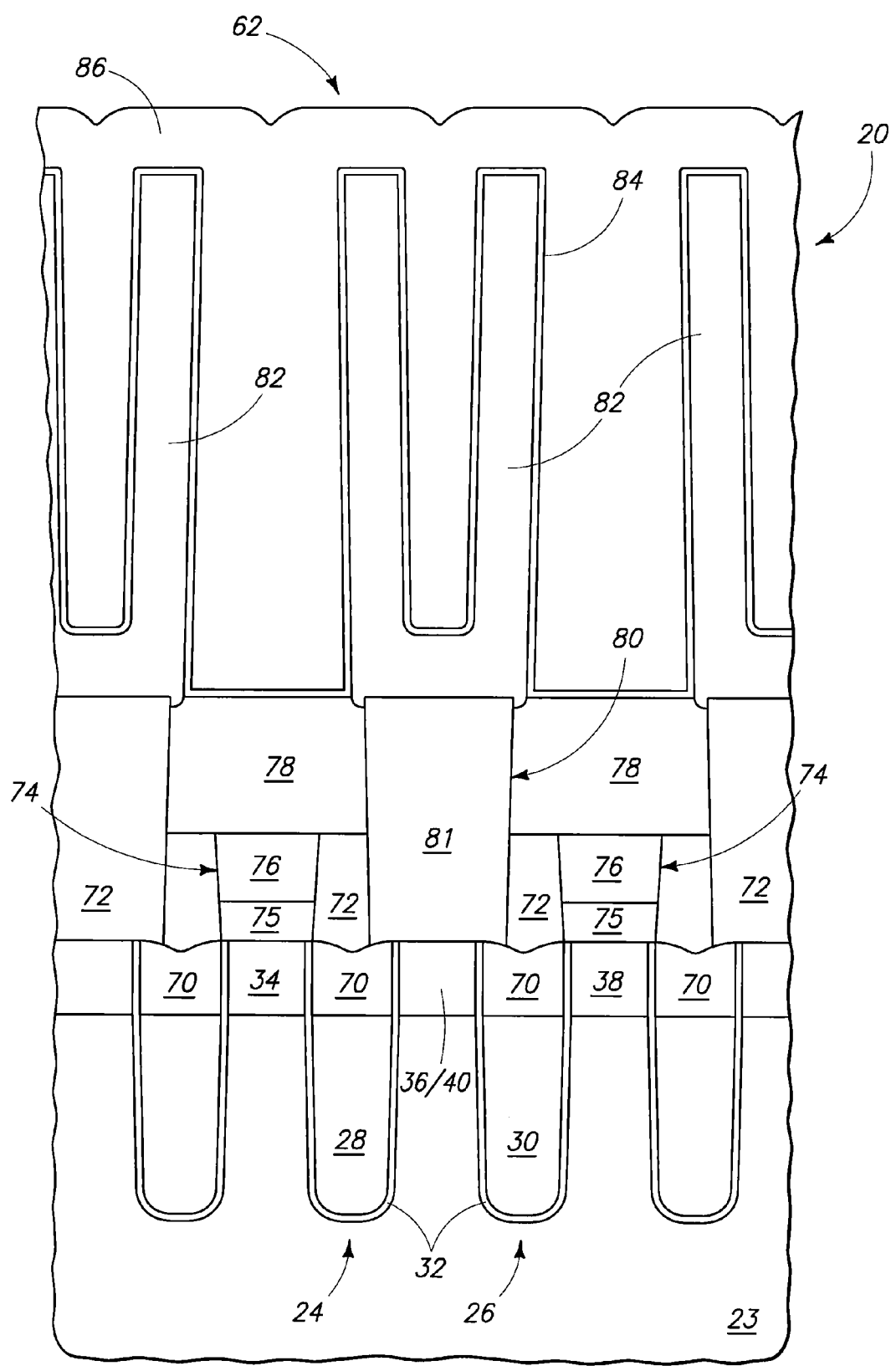
FIG. 5 is a diagrammatic sectional view taken through line 5-5 in FIG. 4.
Figure 6:
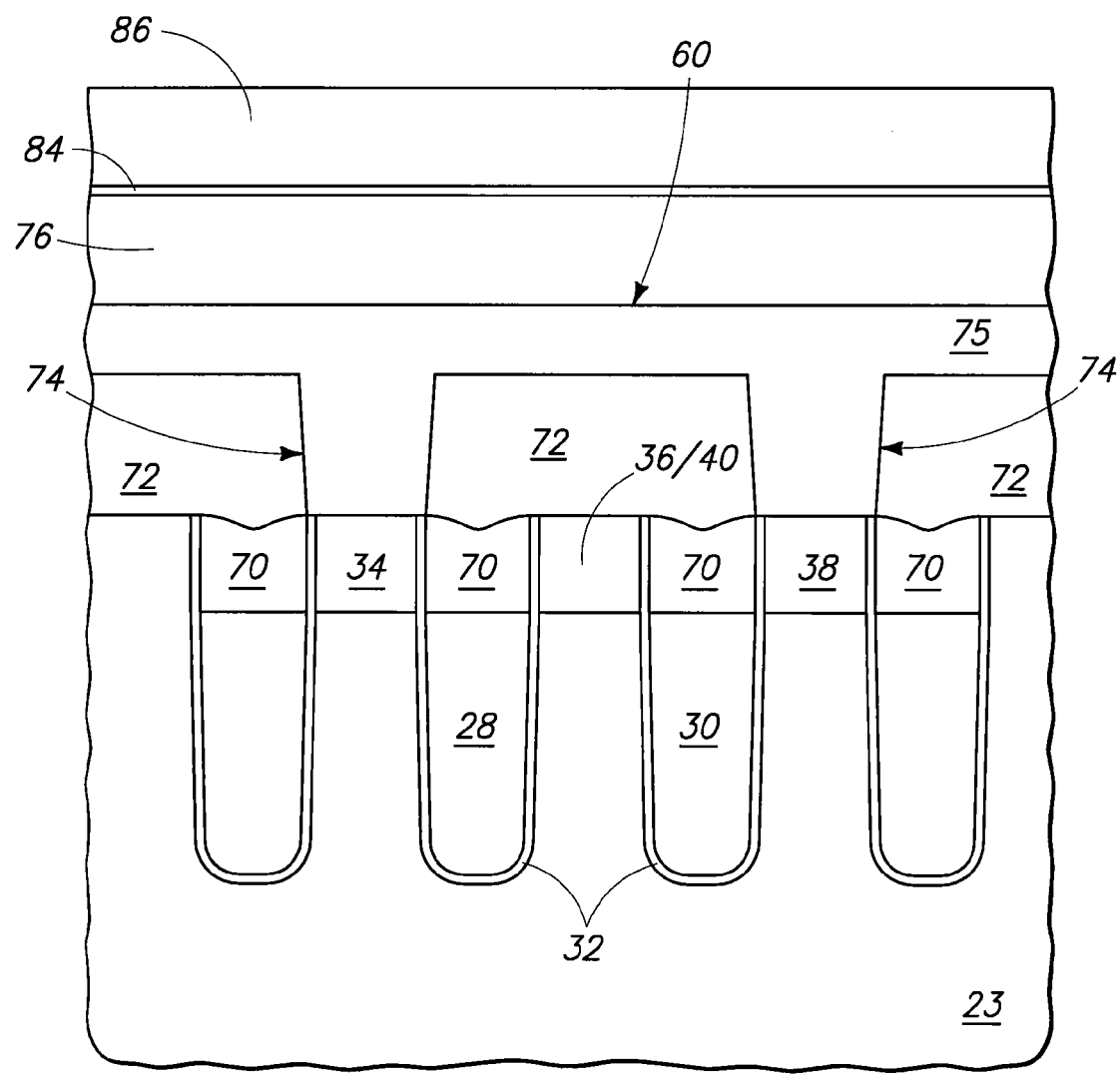
FIG. 6 is a diagrammatic sectional view taken through line 6-6 in FIG. 4.

By way of example only, FIGS. 4-6 depict but exemplary additional construction with respect to that of FIG. 2 incorporating conductive data line and charge storage device structures. Like numerals from FIG. 2 are utilized where appropriate, with additional structure being indicated with additional numerals. Insulative caps 70 are received over conductive gates 28, 30. An example material is silicon nitride. An interlevel dielectric 72 has been formed elevationally outward of semiconductive material 23. An exemplary material is silicon dioxide which might be doped or undoped. Conductive data line contact openings 74 have been formed therethrough to source/drain regions 34 and 38. Conductive material 75 has been deposited and patterned to form conductive data line 60. Such might be formed by a damascene-like process, or by a deposition and subtractive patterning and etch process, by way of examples only. One example method includes the deposition of one or more conductive materials 75, followed by subsequent patterning and subtractive etching thereof. An insulative material 76 might be deposited thereover prior or subsequent to patterning material 75, and the same or different insulative material 76 deposited and subsequently anisotropically etched to form insulative conductive data line sidewall spacers (not shown). Etching to form data line 60 might effectively recess material 75 within contact openings 74 as depicted in the FIG. 5 cross-section, and with some insulative spacer-forming material 76 subsequently being deposited therein over material 75 in the FIG. 5 cross-section.

Another interlevel dielectric layer 78 (FIG. 5) has been deposited. Example materials include doped or undoped silicon dioxide. A contact opening 80 has been etched through interlevel dielectric layer 78 and 72 to shared source/drain region 36/40. Conductive plugging material(s) 81 is received therein. Charge storage device 62 is depicted as comprising a capacitor having a storage node electrode 82 electrically connecting with conductive plug 81 received within contact opening 80. A capacitor dielectric 84 is received outwardly and over storage node electrode 82, and an outer conductive cell plate electrode 86 has been formed thereover. Any exemplary or yet-to-be developed materials are, of course, contemplated for capacitor dielectric 84 and conductive capacitor electrodes 82 and 86.

The depicted FIG. 2 and FIGS. 4-6 constructions are but exemplary depictions of an individual memory cell and of a memory array in accordance with various embodiments of the invention. A person of skill in the art will readily appreciate that such might be manufactured in any of numerous manners, and whether existing or yet-to-be developed. By way of example only, exemplary inventive embodiments of methods of fabricating memory arrays are described with reference to FIG. 7. FIG. 7 is a top view of a semiconductor substrate comprising, by way of example only, a memory array area 100. Alternating lines 101 of active area regions and lines 102 of trench isolation regions have been formed within a suitable semiconductor substrate, for example substrate 22 of the first-described embodiment. A series of race track-shaped trenches 104 have been etched into active area regions 101 and trench isolation regions 102 generally orthogonal to the alternating lines of active area regions 101 and trench isolation regions 102. By way of example only, such can be in the form of openings 29 and 31 of FIG. 2 for the fabrication of individual memory cells. Conductive material is formed within race track-shaped trenches 104 to form a pair of electrically connected word lines with respect to individual ones of the race track-shaped trenches. Example materials are those described above with respect to gates 28 and 30. Accordingly and also in one example embodiment, a gate dielectric (not shown for clarity in FIG. 7) would be formed to line the exemplary depicted race track-shaped trenches 104 prior to provision of gate material 28/30.

Source/drain regions could be formed within the active area regions laterally internal of race track-shaped trenches 104 and laterally external of race track-shaped trenches 104. By way of example only, and with reference to the FIG. 2 embodiment, an exemplary such laterally internal source/drain region is designated with 36/40, and exemplary such laterally external source/drain regions are designated with numerals 34 and 38 in FIG. 7.

Conductive data lines (not shown for clarity in FIG. 7) are formed in electrical connection with the source/drain regions received laterally external of the race track-shaped trenches, for example to source/drain regions 34 and 38 of the exemplary FIGS. 2 and 4-6 embodiments. A charge storage device (not shown for clarity in FIG. 7) is formed in electrical connection with a respective one of the source/drain regions received laterally internal of race track-shaped trenches 104. For example and by way of example only, capacitors or other devices might be formed relative to source/drain regions 36/40 of the FIGS. 2 and 4-6 embodiments. Exemplary separate conductive contacts 110 are shown, by way of example only, received externally of memory array 100 for making electrical connection with respect to conductive material (i.e., conductive materials 28 and 30 with respect to each trench 104) for accessing/activating each word/gate line pair.

An embodiment of the invention encompasses a method of fabricating a memory array which comprises forming alternating lines of active area regions and trench isolation regions within a semiconductor substrate. Exemplary such alternating lines are depicted in FIG. 7, and by way of example only. A series of pairs of trenches are etched into the active area regions and the trench isolation regions generally orthogonal to the alternating lines of active area regions and trench isolation regions. By way of example only, exemplary depicted trench openings 29 and 31 in FIG. 7 are exemplary such series of pairs of trenches, and independent of whether race track-shaped trenches are formed.

Regardless in one implementation, at least one interconnecting trench is etched somewhere within the semiconductor substrate which interconnects individual ones of the trenches of each pair. For example and by way of example only, each of the exemplary depicted half-circle/arch trench sections 112 are an exemplary such interconnecting trench which interconnects respective trench pairs 29 and 31. Only one of such trenches 112 might be fabricated or alternate shaped or configuration trenches might be etched. Further, the exemplary pairs of trenches might be etched at the same time and/or using a common masking step, or separately with respect to masking step and/or etching.

Conductive material is formed within the pairs of trenches and the interconnecting trench to form a pair of electrically connected word lines with respect to individual ones of the pairs of trenches. Such might comprise depositing at least some conductive material within the pairs of trenches and the interconnecting trench at the same time, or at totally at different times. (Interconnecting material/region 64 in FIG. 2 corresponds to such interconnecting trench and conductive material).

Source/drain regions are formed within the active area regions intermediate individual ones of the trenches of each pair, and laterally external of individual ones of the trenches of each pair. Conductive data lines are formed in electrical connection with the source/drain regions received laterally external of individual ones of the trenches of each pair. A charge storage device is formed in electrical connection with respective ones of the source/drain regions received intermediate individual ones of the trenches of each pair. By way of example only, such is depicted with reference to the embodiments of FIG. 2 and FIGS. 4-6.

The above-described exemplary FIG. 2, FIGS. 4-6 and FIG. 7 embodiments might be manufactured by any of a number of existing or yet-to-be developed techniques. Further by way of example only, the depicted trench openings 29, 31 in FIGS. 2, 4-6 and 7 might be manufactured to be sublithographic. For example and by way of example only, trench opening outlines might be fabricated to the minimum capable lithographic feature size in a first hard-masking layer. Thereafter, additional suitably thin hard-masking material can be deposited thereover to line the sidewalls and bases of the trenches formed in the first hard-masking layer(s). Such could be subjected to an anisotropic spacer-like etch, thereby reducing the open width of the trenches prior to etching trench openings 29 and 31 into substrate material 23, and thereby form the depicted trenches to be sublithographic. Further, the hard-masking blocks between trenches might also be fabricated to be sublithographic in an analogous manner by utilizing anisotropically etched hard-masking spacers deposited to a lateral thickness less than that of the then-present minimum photolithographic feature dimension.

Further and regardless, peripheral circuitry gate material might be deposited prior to forming trench openings 29, 31, with trench openings 29, 31 then formed through the peripheral circuitry gate material within array area prior to patterning the peripheral gate material to form field effect transistor gates in peripheral circuitry area. Further by way of example only, the exemplary depicted gate dielectric 32 and gate material(s) 28, 30 might be deposited and planarized back relative to the peripheral conductive gate material within the array prior to removing peripheral gate material from the array. Further and by way of example only, the exemplary depicted recessing of conductive gate material 28, 30 within the memory array might occur commensurate with the etching of peripheral gate material. Further, by way of example only, insulative material 70 formed over conductive gate material 28, 30 might be formed commensurate with the fabrication of, and of the same material as, insulative spacers formed with respect to peripheral gate constructions. Any other existing or yet-to-be developed processing is, of course, contemplated with respect to fabricating any of the structures identified and claimed herein, as well as in connection with methods of fabricating a memory array as claimed and described herein.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

The invention claimed is:

1. A method of fabricating a memory array, comprising:
   forming alternating lines of active area regions and trench isolation regions within semiconductive material;
   etching a series of racetrack-shaped trenches into the active area regions and the trench isolation regions generally orthogonal to the alternating lines of active area regions and trench isolation regions;
   forming conductive material within the racetrack-shaped trenches to form a pair of electrically connected word lines in each of the racetrack-shaped trenches;
   forming source/drain regions within the active area regions laterally internal of the racetrack-shaped trenches and laterally external of the racetrack-shaped trenches;
   forming conductive data lines in electrical connection with the source/drain regions formed laterally external of the racetrack-shaped trenches; and
   forming charge storage devices in electrical connection with the source/drain regions formed laterally internal of the racetrack-shaped trenches.

2. A method of fabricating a memory array, comprising:
   forming alternating lines of active area regions and trench isolation regions within semiconductive material;
   etching a series of pairs of trenches into the active area regions and the trench isolation regions generally orthogonal to the alternating lines of active area regions and trench isolation regions;
   etching interconnecting trenches into the semiconductive material, each of the interconnecting trenches interconnecting individual of the trenches of each pair of trenches;
   forming conductive material within the pairs of trenches and the interconnecting trenches to form a pair of electrically connected word lines in each of the pairs of trenches;
   forming source/drain regions within the active area regions intermediate individual ones of the trenches of each pair of trenches and laterally external of individual ones of the trenches of each pair of trenches;
   forming conductive data lines in electrical connection with the source/drain regions formed laterally external of individual ones of the trenches of each pair of trenches; and
   forming charge storage devices in electrical connection with the source/drain regions formed intermediate individual ones of the trenches of each pair of trenches.

3. The method of claim 2 wherein etching the series of pairs of trenches and etching the interconnecting trenches comprises a common masking step.

4. The method of claim 2 wherein etching the series of pairs of trenches and etching the interconnecting trenches comprises a common etching step.

5. The method of claim 2 wherein forming the conductive material comprises depositing at least some conductive material within the pairs of trenches and the interconnecting trenches at the same time.

6. The method of claim 2 wherein etching the interconnecting trenches comprises etching only one interconnecting trench for each pair of trenches.

7. The method of claim 2 wherein etching the interconnecting trenches comprises etching only two interconnecting trenches for each pair of trenches.

8. The method of claim 2 wherein etching the interconnecting trenches comprises etching multiple interconnecting trenches for each pair of trenches.

9. A method of fabricating a memory array, comprising:
forming alternating lines of active area regions and trench isolation regions within semiconductive material;
etching a series of pairs of trenches into the active area regions and the trench isolation regions generally orthogonal to the alternating lines of active area regions and trench isolation regions;
forming conductive material within the pairs of trenches to form a pair of word lines in each of the pairs of trenches;
forming source/drain regions within the active area regions intermediate individual ones of the trenches of each pair of trenches and laterally external of individual ones of the trenches of each pair of trenches;
forming conductive data lines in electrical connection with the source/drain regions formed laterally external of individual ones of the trenches of each pair of trenches; and
forming charge storage devices in electrical connection with the source/drain regions formed intermediate individual ones of the trenches of each pair, wherein individual memory cells of the memory array each comprise a respective one of the source/drain regions formed intermediate the respective pair of trenches within which the respective pair of word lines is formed, a respective two of the source/drain regions formed laterally external of the respective pair of trenches within which the respective pair of word lines is formed, and the charge storage device that is in electrical connection with the respective source/drain region formed intermediate the respective pair of trenches within which the respective pair of word lines is formed.

10. The method of claim 9 comprising:
etching interconnecting trenches into the semiconductive material, wherein each of the interconnecting trenches interconnects individual ones of the trenches of each respective pair of trenches; and
forming conductor material within the interconnecting trenches to electrically connect respective individual word lines within each respective pair of word lines.

11. The method of claim 9 comprising depositing peripheral circuitry gate material within memory array area and within peripheral circuitry area prior to the etching of the series of pairs of trenches, the etching of the series of pairs of trenches being conducted through the peripheral circuitry gate material that is within the memory array area prior to patterning the peripheral circuitry gate material to form transistor gates in the peripheral circuitry area.

12. The method of claim 9 wherein the forming of the conductive data lines comprises:
forming an interlevel dielectric and contact openings therethrough to the source/drain regions formed laterally external of individual ones of the trenches of each pair of trenches; and
depositing a conductor material within the contact openings and forming the conductive data lines from the conductor material.

13. The method of claim 12 wherein the forming of the conductive data lines from the conductor material comprises subtractive patterning and etch of the conductor material.

14. The method of claim 12 comprising depositing an insulative material over the conductor material prior to the forming of the conductive data lines from the conductor material.

15. The method of claim 12 comprising depositing an insulative material in physical touching contact with the conductor material after the forming of the conductive data lines from the conductor material.

16. The method of claim 12 wherein the forming of the conductive data lines from the conductor material comprises etching of the conductor material to recess the conductor material within the contact openings.

17. The method of claim 16 comprising forming insulative material within the contact openings over recessed conductor material.

* * * * *